(12) United States Patent
Guenther

(10) Patent No.: US 10,365,301 B2
(45) Date of Patent: Jul. 30, 2019

(54) OSCILLOSCOPE ACQUISITION SYSTEM

(71) Applicant: Rohde & Schwarz GmbH & Co. KG, Munich (DE)

(72) Inventor: Mario Guenther, Glauchau (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 180 days.

(21) Appl. No.: 15/583,386

(22) Filed: May 1, 2017

(65) Prior Publication Data

US 2018/0313871 A1 Nov. 1, 2018

(51) Int. Cl.
*G01R 23/02* (2006.01)
*G01R 13/02* (2006.01)

(52) U.S. Cl.
CPC .......... *G01R 13/0254* (2013.01); *G01R 23/02* (2013.01)

(58) Field of Classification Search
CPC .... G01R 13/02; G01R 13/0218; G01R 23/02; G01R 19/02; G01R 31/2841; G01R 35/005
See application file for complete search history.

(56) References Cited

U.S. PATENT DOCUMENTS

| 5,303,262 | A | * | 4/1994 | Johnson | H04L 7/0334 375/224 |
| 6,356,067 | B1 | * | 3/2002 | Nara | G01R 23/16 324/76.19 |
| 9,891,268 | B2 | * | 2/2018 | Lebon | G01R 31/002 |
| 2002/0039027 | A1 | * | 4/2002 | Hung | G01R 19/175 324/613 |
| 2014/0062455 | A1 | * | 3/2014 | Nakayama | G01R 35/005 324/76.39 |
| 2015/0260801 | A1 | * | 9/2015 | Trent | G01R 31/40 324/76.39 |
| 2016/0363614 | A1 | * | 12/2016 | Mochizuki | G01R 13/0272 |

FOREIGN PATENT DOCUMENTS

JP 2011-185823 A 9/2011

* cited by examiner

*Primary Examiner* — Thang X Le
(74) *Attorney, Agent, or Firm* — Christensen O'Connor Johnson Kindness PLLC

(57) ABSTRACT

An oscilloscope acquisition system comprises a trigger unit that is configured to receive an input signal and to generate an output signal, a frequency determination unit that is configured to receive the output signal and to determine the frequency of the output signal, and a time determination unit that is configured to determine a dynamic auto-trigger time value, wherein the time determination unit is configured to derive the dynamic auto-trigger time from the frequency of the output signal.

16 Claims, 4 Drawing Sheets

OSCILLOSCOPE ACQUISITION SYSTEM

FIELD OF THE DISCLOSURE

Embodiments of the present disclosure relate generally to an oscilloscope acquisition system as well as a method for operating an oscilloscope acquisition system.

BACKGROUND

Known oscilloscopes comprise a trigger unit which is needed in order to obtain a static image of a measured signal. In normal mode, the trigger unit halts a renewal of the image until a certain trigger condition is satisfied, for example an input voltage level (trigger level) and a direction in which the input voltage level is crossed.

In automatic mode, the trigger unit initiates a renewal of the image after a predefined time called auto-trigger time even if the trigger condition has not been met.

If a frequency of the input signal is low, and more precisely, if the frequency is such that a time between two parts of the measured signal meeting the trigger condition exceeds the auto-trigger time, the image of the measured signal becomes unstable. This is due to the image being renewed alternately because of the trigger condition met and the auto-trigger time exceeded, respectively.

In known oscilloscopes, a static image of such a measured signal of low frequency can be obtained by switching to normal mode. However, the image will only be renewed when the trigger condition is met because the auto-trigger is switched off.

Accordingly, there is a need for an oscilloscope acquisition system as well as a method for operating an oscilloscope acquisition system that is capable of obtaining a static image of a measured signal of low frequency while retaining an operative auto-trigger.

SUMMARY

Embodiments of the present disclosure provide an oscilloscope acquisition system. The oscilloscope acquisition system comprises a trigger unit that is configured to receive an input signal and to generate an output signal, a frequency determination unit that is configured to receive the output signal and to determine the frequency of the output signal, and a time determination unit that is configured to determine a dynamic auto-trigger time value. In some embodiments, the time determination unit is configured to derive the dynamic auto-trigger time from the frequency of the output signal.

Therefore, the dynamic auto-trigger time is adapted to the frequency of the output signal, in particular automatically. This ensures that a static image of the output signal is obtained even if the frequency of the output signal is low. The auto-trigger function is still operative, but adapted appropriately. Therefore, the auto-trigger time value is flexible as it is adapted to the frequency determined. Hence, the images obtained by the oscilloscope acquisition system can be evaluated easily due to the fact that static images are provided.

According to an aspect of the present disclosure, the dynamic auto-trigger time is variable depending on the frequency of the output signal. This means that the auto-trigger time is dynamically adapted to the frequency of the output signal, thereby ensuring that a static image of the output signal is obtained even if the frequency of the output signal varies over time, for example if the frequency of the output signal decreases over time.

According to another aspect of the present disclosure, the trigger unit comprises a signal acquisition unit, an input and an output. The trigger unit may further comprise an internal storage unit for storing output data. Via the output, the trigger unit may communicate with one or several other components of an oscilloscope. In some embodiments, the at least one other component is controlled by trigger unit appropriately, for instance triggered. For example, the signal acquisition performed by the signal acquisition unit is terminated due to the auto-trigger time value determined.

In one embodiment, the output signal corresponds to the input signal being digitized at a predetermined trigger level. Thus, output data is available in digital form with additional information about points of time where a trigger condition was met. The digital output data can be used for analysing the output signal, for example for determining the frequency of the output signal.

In a further aspect, the time determination unit is configured to determine the dynamic auto-trigger time to be substantially the inverse of the frequency of the output signal. If the output signal comprises of several non-zero frequencies, the dynamic auto-trigger time is determined to be substantially the inverse of the lowest of the several non-zero frequencies. Thus, the image of the output signal remains static for a time span that is substantially equal to the inverse of the lowest of the non-zero frequencies. The trigger unit initiates a renewal of the image only when the trigger condition has not been met for a time longer than the time span.

According to a further aspect, the dynamic auto-trigger time determined by the time determination unit is the inverse of the frequency of the output signal or longer. If the output signal comprises of several non-zero frequencies, the dynamic auto-trigger time is the inverse of the lowest of the non-zero frequencies or longer. Thus, statistical fluctuations of the output signal and inaccuracies in determining the frequency of the output signal do not cause the image to become unstable. The evaluation of the images is ensured accordingly.

In a certain embodiment, the dynamic auto-trigger time is up to 20 percent longer than the inverse of the frequency of the output signal. Thus, statistical fluctuations of the output signal and inaccuracies in determining the frequency of the output signal do not cause the image to become unstable, even if these uncertainties are large.

According to another aspect, the dynamic auto-trigger time is 5 to 15 percent longer than the inverse of the frequency of the output signal. Thus, statistical fluctuations of the output signal and inaccuracies in determining the frequency of the output signal do not cause the image to become unstable as long as the statistical fluctuations and inaccuracies stay within this range of percentage mentioned.

In one embodiment, the dynamic auto-trigger time is 8 to 12 percent longer than the inverse of the frequency of the output signal. Thus statistical fluctuations of the output signal and inaccuracies in determining the frequency of the output signal do not cause the image to become unstable while not choosing the auto-trigger time to be too long.

Embodiments of the present disclosure also provide a method for operating an oscilloscope acquisition system. The method comprises the following: receiving an input signal; generating an output signal from the input signal; determining a frequency of the output signal; and determining a dynamic auto-trigger time from the frequency of the output signal. In some embodiments, the dynamic auto-trigger time is determined to be equal to or longer than the inverse of the frequency of the output signal.

Therefore, the dynamic auto-trigger time is adapted to the frequency of the output signal. This ensures that a static image of the output signal is obtained even if the frequency of the output signal is low while an operative auto-trigger being retained. Moreover, due to the dynamic auto-trigger time being determined to be equal to or longer than the inverse of the frequency of the output signal, statistical fluctuations of the output signal and inaccuracies in determining the frequency of the output signal do not cause the image to become unstable, for example, for a signal having a low frequency.

According to one aspect, the dynamic auto-trigger time is variable depending on the frequency of the output signal. This means that the auto-trigger time is dynamically adapted to the frequency of the output signal, thereby ensuring that a static image of the output signal is obtained even if the frequency of the output signal varies over time, for example, if the frequency of the output signal decreases over time. The auto-trigger time value used is a flexible one as it is adapted appropriately while taking the frequency of the output signal into account.

According to another aspect, the output signal corresponds to the input signal being digitized at a predetermined trigger level. Thus, output data is available in digital form with additional information about points of time where a trigger condition was met. The digital output data can be used for analysing the output signal, for example, for determining the frequency of the output signal. Furthermore, the digitized output data can be forwarded to at least one other component for further processing.

The dynamic auto-trigger time may be up to 20 percent longer than the inverse of the frequency of the output signal. In other embodiments, the dynamic auto-trigger time may be up to 5 to 15 percent longer than the inverse of the frequency of the output signal.

In other embodiments, the dynamic auto-trigger time may be up to 8 to 12 percent longer than the inverse of the frequency of the output signal. Thus, statistical fluctuations of the output signal and inaccuracies in determining the frequency of the output signal do not cause the image to become unstable while not choosing the auto-trigger time to be too long as already described.

In one embodiment the method further comprises the step of adjusting an auto-trigger time of the trigger unit to be equal to the dynamic auto-trigger time determined. Thus, the auto-trigger time of the trigger unit is dynamically adapted to the dynamic auto-trigger time. This ensures that a static image of the output signal is obtained even if the frequency of the output signal is low while the operative auto-trigger is retained.

In a further aspect, a signal acquisition unit of the oscilloscope acquisition system is controlled by the dynamic auto-trigger time determined. In some embodiments, the auto-trigger time of an auto-trigger feature of the signal acquisition unit is set by the dynamic auto-trigger time determined. Thus, the auto-trigger time is adapted to the frequency of the output signal, thereby obtaining a static image of the output signal. Moreover, the acquisition of the input signal can be terminated by the auto-trigger appropriately.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawing, wherein

DETAILED DESCRIPTION

The detailed description set forth below in connection with the appended drawing, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

In the following description, numerous specific details are set forth in order to provide a thorough understanding of one or more embodiments of the present disclosure. It will be apparent to one skilled in the art, however, that many embodiments of the present disclosure may be practiced without some or all of the specific details. In some instances, well-known process steps have not been described in detail in order not to unnecessarily obscure various aspects of the present disclosure. Further, it will be appreciated that embodiments of the present disclosure may employ any combination of features described herein.

Figure 1:
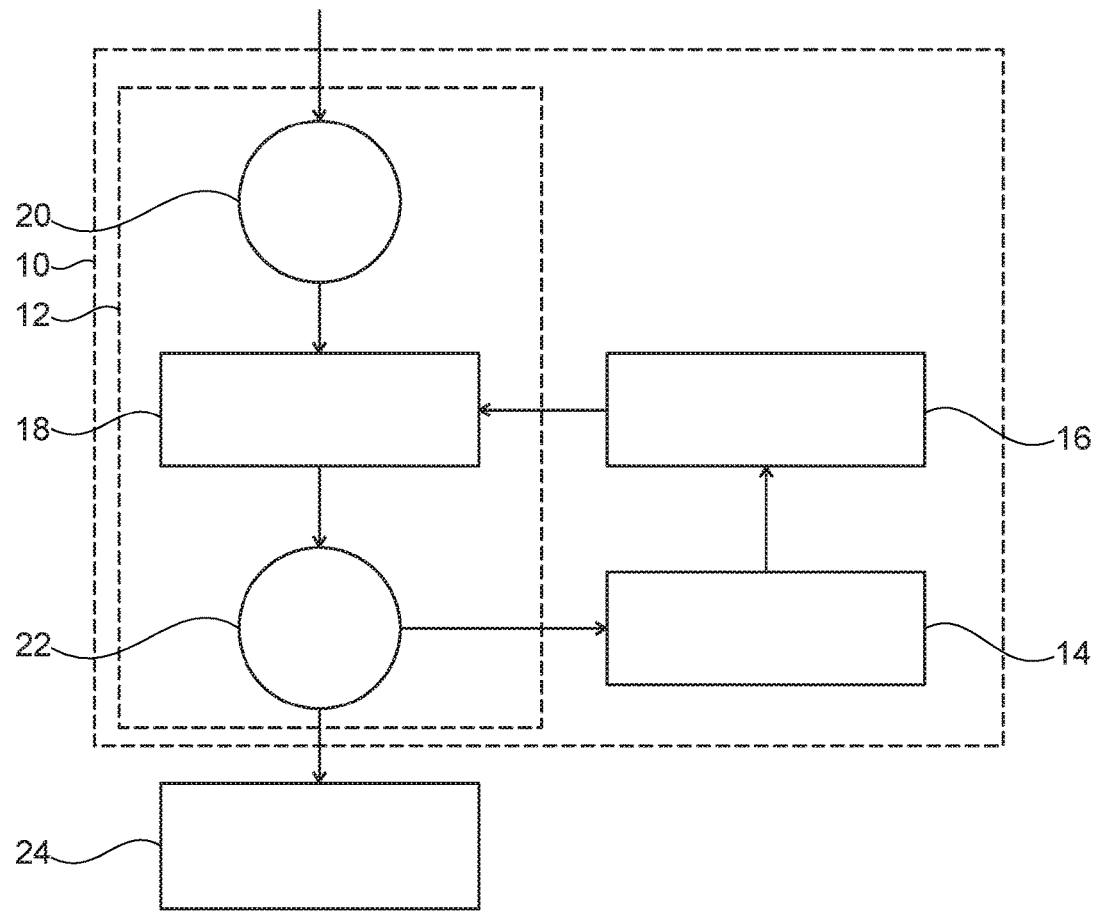
FIG. 1 shows a schematic overview of one representative embodiment of an oscilloscope acquisition system according to an aspect of the disclosure.

In FIG. 1, an oscilloscope acquisition system 10 with a trigger unit 12, a frequency determination unit 14 and a time determination unit 16 is shown. The trigger unit 12 comprises a signal acquisition unit 18, an input 20 and an output 22. The arrows in FIG. 1 depict the flow of data and/or signals within the oscilloscope acquisition system 10.

The trigger unit 12 is configured to receive an input signal via the input 20 and to generate an output signal via the signal acquisition unit 18, wherein the output signal corresponds to the input signal digitized at a predetermined trigger level. Thus, besides time and voltage, the output signal contains additional information for every data point whether a trigger condition is met, which will be described in more detail below. The output signal is sent to the frequency determination unit 14 and, possibly via a memory unit and other additional components, to a graphic display unit 24 via the output 22. The output signal may also be stored in an internal storage unit of the trigger unit 12.

The frequency determination unit 14 is configured to receive the output signal from the output 22 and to determine the frequency of the output signal. In some embodiments, the frequency determination unit 14 may be configured to perform a fast Fourier transform (FFT) of the output signal from time domain to frequency domain. By using the FFT, frequencies contained in the output signal can be computed. In the following, it is understood that the frequency of the output signal is the lowest, non-zero frequency contained in the output signal. Alternatively, the frequency determination unit 14 may be a frequency counter, which accumulates a number of events occurring in the output signal within a specific period of time.

Still referring to FIG. 1, the time determination unit 16 is configured to determine a dynamic auto-trigger time value by deriving it from the frequency of the output signal. In some embodiments, the dynamic auto-trigger time is determined to be substantially the inverse of the frequency of the output signal or longer. Accordingly, the time determination unit 16 determines the frequency of the output signal wherein this frequency determined is used for setting the auto-trigger time value in a flexible manner appropriately. Thus, the auto-trigger time value is dynamically adapted with regard to the frequency of the signal processed ensuring that a static image is displayed on the display unit 24.

The dynamic auto-trigger time determined may be up to 20 percent longer than the inverse of the frequency of the output signal or longer. Alternatively, the dynamic auto-trigger time may be 5 to 15 percent longer than the inverse of the frequency of the output signal. In a different embodiment, the dynamic auto-trigger time may be 8 to 12 percent longer than the inverse of the frequency of the output signal.

In general, the dynamic auto-trigger time, for example, its lengthening, may be variable depending on the frequency of the output signal.

Figure 2:
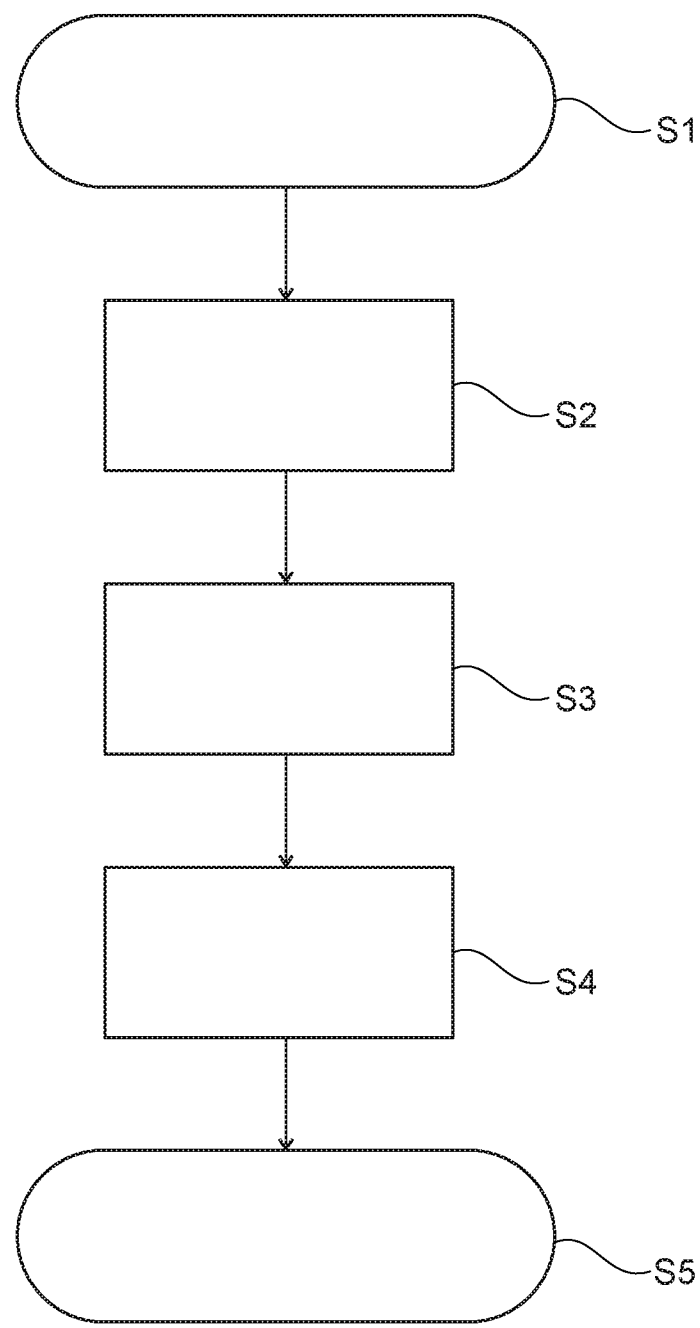
FIG. 2 shows a schematic flow chart of one embodiment of a method according to an aspect of the disclosure.

A method for operating the oscilloscope acquisition system 10 is illustrated in FIG. 2. As shown in FIG. 2, when an input signal, for example a voltage which varies over time, is received via the input 20 (step S1) of the oscilloscope acquisition system 10, the input signal is handed over to the signal acquisition unit 18 being integrated in the oscilloscope acquisition system 10. A simple example for such an input signal is the sawtooth voltage $V_{in}(t)$ shown in FIGS. 3 and 4. An output signal is then generated from the input signal by the signal acquisition unit 18 (step S2) being also embedded in the oscilloscope acquisition system 10.

In some embodiments, the output signal is generated by digitizing the input signal at a predetermined trigger level. Thus, information comprising time, voltage and whether a trigger condition is met is generated for every data point wherein this information is inter alia sent to the output 22. The output signal may also be stored in an internal storage unit of the trigger unit 12.

In the example shown in FIGS. 3 and 4, the trigger condition is met when the input voltage $V_{in}(t)$ crosses a trigger level $V_{tr}$ from below, which is among others the case at times $t_1$ and $t_2$. When the trigger condition is met, the trigger unit 12 initiates a renewal of an image of the output signal on the graphic display unit 24, thus obtaining a static image of the output signal.

The trigger unit 12 also initiates a renewal of the image of the output signal if the trigger condition has not been met for a predetermined time called auto-trigger time $T_{tr}$.

Figure 3:
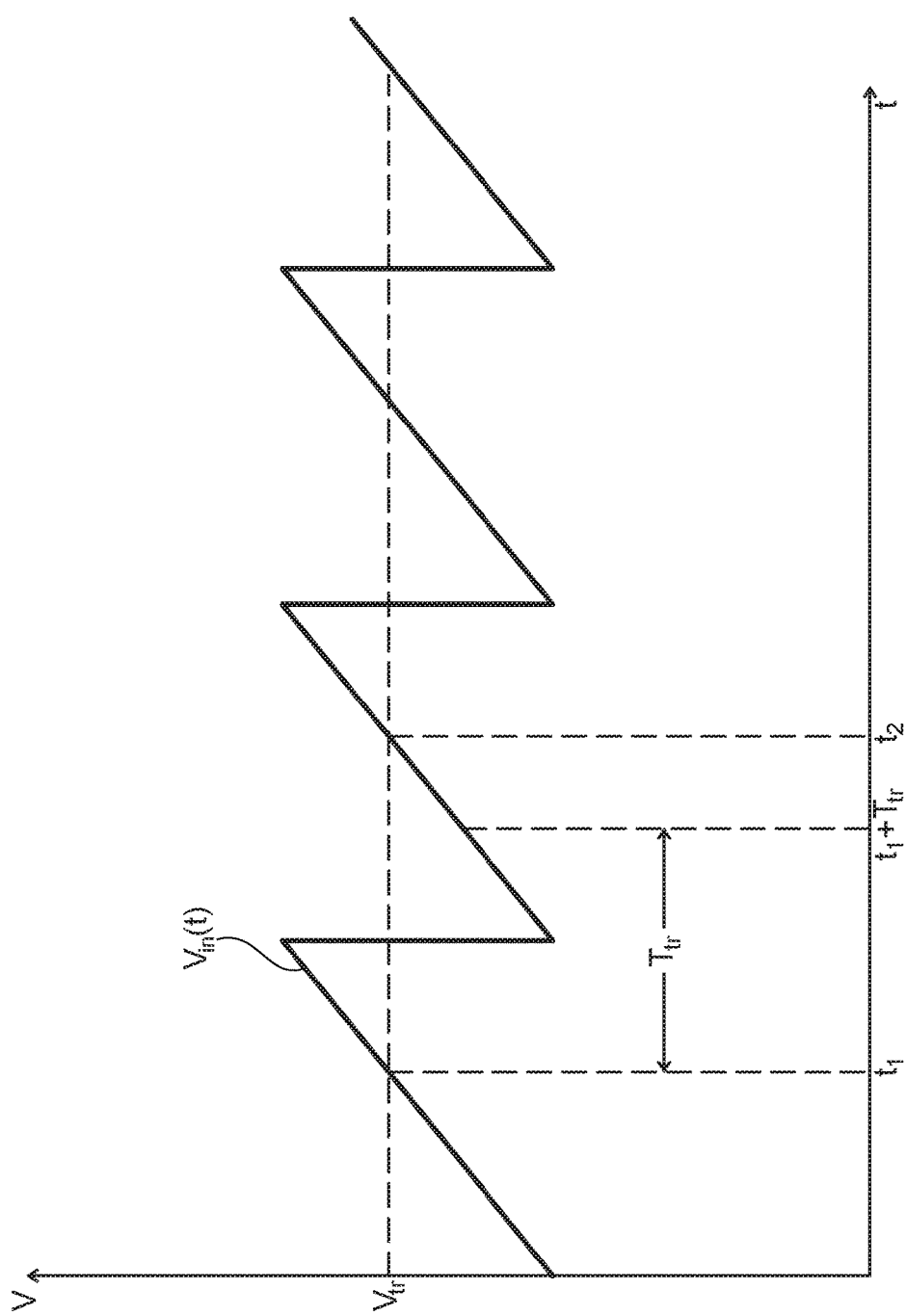
FIG. 3 shows an example of an input signal with an usual auto-trigger time and resulting trigger events.

In the example shown in FIG. 3, the auto-trigger time $T_{tr}$ is shorter than the time between two trigger events $t_2-t_1$. The image of the output signal is thus renewed at a time $t_1+T_{tr}$ as well as at time $t_2$. In spite of the input signal being periodic, this leads to an unstable, possibly flickering image of the output signal on the display unit 24. Therefore, the auto-trigger time $T_{tr}$ needs to be adjusted, as described in the following.

The output signal is received and processed by the frequency determination unit 14 in order to determine the frequency of the output signal (step S3 in FIG. 2). This may be achieved by utilizing a fast Fourier transform (FFT) from time domain into frequency domain. By transforming the output signal into frequency domain, the frequency spectrum of the output signal can be computed. The frequency of the output signal is then determined to be the lowest, non-zero frequency contained in the frequency spectrum.

Alternatively, the frequency of the output signal may be determined by using a frequency determination unit 14 which may be configured as a frequency counter for counting a number of pulses of the output signal within a given time range. The frequency is then determined to be the counted number of pulses divided by the time range.

A dynamic auto-trigger time is now determined from the frequency determined by the time determination unit 16 (see, e.g., step S4 in FIG. 2). In some embodiments, the dynamic auto-trigger time is determined to be equal to or longer than the inverse of the frequency of the output signal.

For example, the dynamic auto-trigger time may be up to 20 percent longer than the inverse of the frequency of the output signal or longer. Alternatively, the dynamic auto-trigger time may be 5 to 15 percent longer than the inverse of the frequency of the output signal. In a different embodiment, the dynamic auto-trigger time may be 8 to 12 percent longer than the inverse of the frequency of the output signal.

The auto-trigger time $T_{tr}$ of the trigger unit 12, more specifically of the signal acquisition unit 18, is then adjusted to be equal to the dynamic auto-trigger time determined by the time determination unit 16 (see, e.g., step S5). For instance, the signal acquisition unit 18 is controlled by the dynamic auto-trigger time determined previously in an appropriate manner. This means that the auto-trigger time is higher than the inverse of the frequency of the output signal. Thus, a static image of the output signal is obtained.

Figure 4:
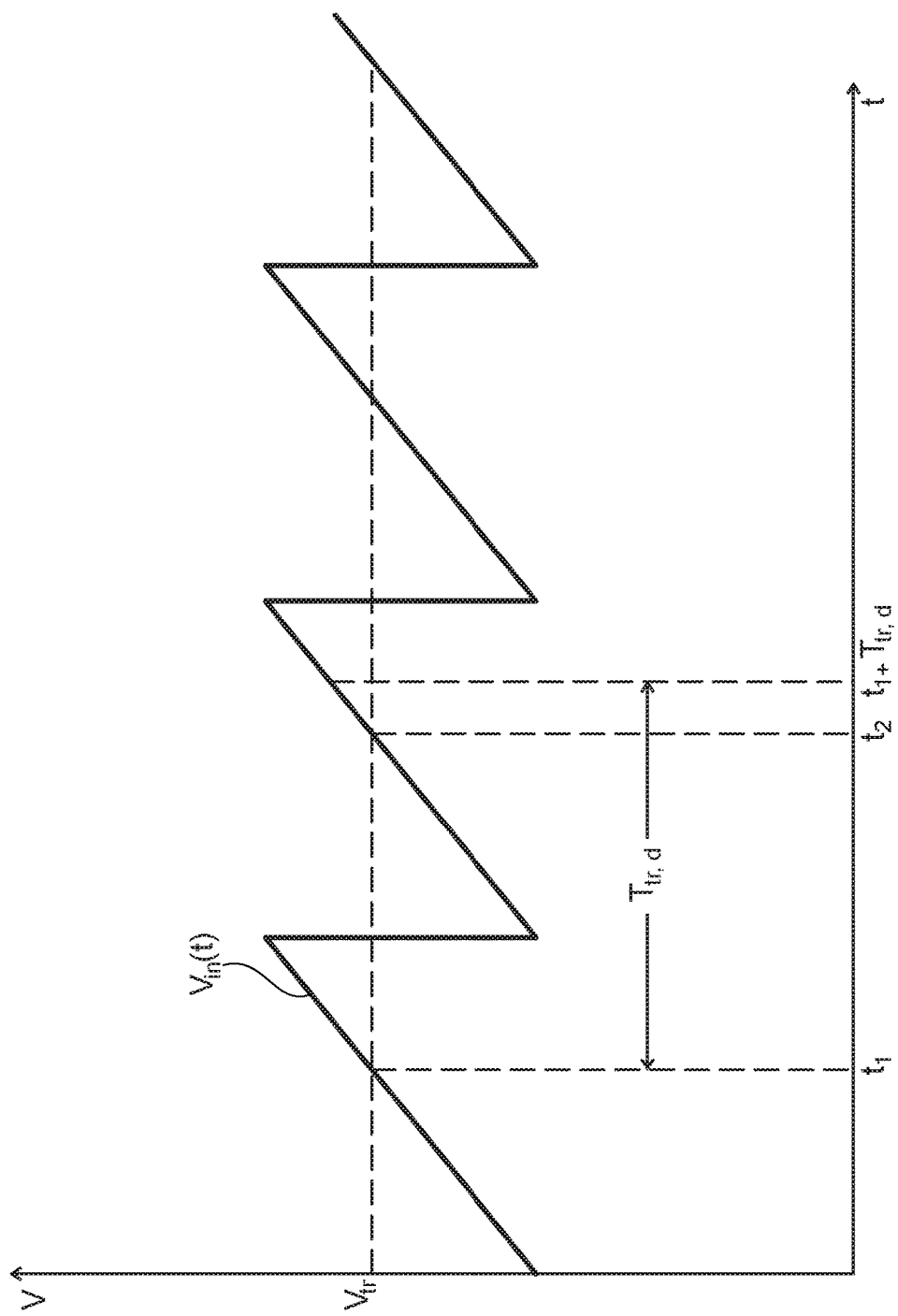
FIG. 4 shows the input signal of FIG. 3 with a dynamic auto-trigger time according to an embodiment of the disclosure.

The result of the steps S1 to S5 described above applied to the case shown in FIG. 3 is illustrated in FIG. 4, which shows the same input sawtooth voltage $V_{in}(t)$ as in FIG. 3. The auto-trigger time of the trigger unit 12 has been adjusted to be $T_{tr,d}$, which is longer than the inverse of the output signal frequency $1/(t_2-t_1)$. Now, trigger events happen at times $t_1$ and $t_2$, without a renewal of the image of the output signal being initiated in between due to a static auto-trigger time. Therefore, a static image is obtained.

The flexible auto-trigger time value is determined automatically based upon the signal processed by the oscilloscope acquisition system 10, for example, its frequency.

Moreover, the auto-trigger time of the trigger unit 12 may be adjusted regularly. In other words, the above mentioned steps S1 to S5 may be repeated regularly. Therefore, the auto-trigger time of the trigger unit 12 is dynamically adjusted in such a way, that the auto-trigger time is (always) higher than the inverse of the frequency of the output signal, even if the output signal varies over time.

Furthermore, a trigger hold-off time may be taken into account while determining the dynamic auto-trigger time value by the time determination unit 16.

Generally, the dynamic auto-trigger time value can be used to control a component of the oscilloscope acquisition system 10, for instance the signal acquisition unit 18. Hence, the acquisition of the signal can be terminated when the dynamic auto-trigger time lapsed.

The setting of the auto-trigger time value relates to a programmable auto-trigger time.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. An oscilloscope acquisition system, comprising:
   a trigger unit that is configured to receive an input signal and to generate an output signal;
   a frequency determination unit that is configured to receive said output signal and to determine the frequency of said output signal; and
   a time determination unit that is configured to determine a dynamic auto-trigger time, said time determination unit being configured to derive said dynamic auto-trigger time from the frequency of said output signal, wherein said dynamic auto-trigger time is determined to be equal to or longer than the inverse of the frequency of said output signal.

2. The oscilloscope acquisition system according to claim 1, wherein said dynamic auto-trigger time is variable depending on the frequency of said output signal.

3. The oscilloscope acquisition system according to claim 1, wherein said trigger unit comprises a signal acquisition unit, an input and an output.

4. The oscilloscope acquisition system according to claim 1, wherein said output signal corresponds to said input signal being digitized at a predetermined trigger level.

5. The oscilloscope acquisition system according to claim 1, wherein said time determination unit is configured to determine said dynamic auto-trigger time to be substantially the inverse of the frequency of said output signal.

6. The oscilloscope acquisition system according to claim 1, wherein said dynamic auto-trigger time is up to 20 percent longer than the inverse of the frequency of said output signal.

7. The oscilloscope acquisition system according to claim 6, wherein said dynamic auto-trigger time is 5 to 15 percent longer than the inverse of the frequency of said output signal.

8. The oscilloscope acquisition system according to claim 7, wherein said dynamic auto-trigger time is 8 to 12 percent longer than the inverse of the frequency of said output signal.

9. A method for operating an oscilloscope acquisition system, the oscilloscope acquisition system including a trigger unit, a frequency determination unit, and a time determination unit, the method comprising the steps of:
   receiving, by the trigger unit, an input signal;
   generating, by the trigger unit, an output signal from said input signal;
   determining, by the frequency determination unit, a frequency of said output signal; and
   determining, by the time determination unit, a dynamic auto-trigger time from the frequency of said output signal,
   wherein said dynamic auto-trigger time is determined to be equal to or longer than the inverse of the frequency of said output signal.

10. The method for operating an oscilloscope acquisition system according to claim 9, wherein said dynamic auto-trigger time is variable depending on the frequency of said output signal.

11. The method for operating an oscilloscope acquisition system according to claim 9, wherein said output signal corresponds to said input signal being digitized at a predetermined trigger level.

12. The method for operating an oscilloscope acquisition system according to claim 9, wherein said dynamic auto-trigger time is up to 20 percent longer than the inverse of said frequency of said output signal.

13. The method for operating an oscilloscope acquisition system according to claim 9, wherein said dynamic auto-trigger time is 5 to 15 percent longer than the inverse of said frequency of said output signal.

14. The method for operating an oscilloscope acquisition system according to claim 9, wherein said dynamic auto-trigger time is 8 to 12 percent longer than the inverse of said frequency of said output signal.

15. The method for operating an oscilloscope acquisition system according to claim 9, wherein the method further comprises the step of:
   adjusting an auto-trigger time of said trigger unit to be equal to said dynamic auto-trigger time determined.

16. The method for operating an oscilloscope acquisition system according to claim 9, wherein a signal acquisition unit of said oscilloscope acquisition system is controlled by said dynamic auto-trigger time determined.

* * * * *